US012782399B2

(12) United States Patent
Kim et al.

(10) Patent No.: US 12,782,399 B2
(45) Date of Patent: Nov. 3, 2026

(54) ZERO CURRENT DETECTION DEVICE

(71) Applicant: Korea Advanced Institute of Science and Technology, Daejeon (KR)

(72) Inventors: Chul Kim, Daejeon (KR); Yechan Park, Daejeon (KR); Jaeouk Cho, Daejeon (KR); Hongkyun Kim, Daejeon (KR); Seong Jae Moon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 150 days.

(21) Appl. No.: 18/745,692

(22) Filed: Jun. 17, 2024

(65) Prior Publication Data

US 2025/0044328 A1 Feb. 6, 2025

(30) Foreign Application Priority Data

Jul. 31, 2023 (KR) ........................ 10-2023-0100053

(51) Int. Cl.
*G01R 19/17* (2006.01)
*G01R 19/175* (2006.01)
*G01R 19/25* (2006.01)

(52) U.S. Cl.
CPC ........... *G01R 19/17* (2013.01); *G01R 19/175* (2013.01); *G01R 19/25* (2013.01)

(58) Field of Classification Search
CPC ............. G05F 1/573; G05F 3/26; G05F 3/262
See application file for complete search history.

(56) References Cited

U.S. PATENT DOCUMENTS 4,484,092 A * 11/1984 Campbell, Jr. .. H03K 19/01714 326/88
2010/0148740 A1* 6/2010 Saitoh ................. H02M 3/1582 323/283
2015/0214827 A1* 7/2015 Yoon ........................ H02M 1/14 323/286
2016/0028302 A1* 1/2016 Low ...................... H02M 3/073 363/50
2020/0153338 A1* 5/2020 Ribarich ................. H02M 1/08

FOREIGN PATENT DOCUMENTS

KR 10-2011-0129653 A 12/2011
KR 10-2015-0089603 A 8/2015

OTHER PUBLICATIONS

Office Action in received in Korean Application No. 10-2023-0100053 dated Aug. 25, 2025.

* cited by examiner

*Primary Examiner* — Raul J Rios Russo
*Assistant Examiner* — Temilade S Rhodes-Vivour
(74) *Attorney, Agent, or Firm* — Knobbe, Martens, Olson & Bear, LLP

(57) ABSTRACT

A zero current detection device is proposed. The device may include a scaling circuit unit configured to generate a first voltage which is scaled from a target voltage. The device may also include a mirroring circuit unit configured to generate a mirroring current when the first voltage is higher than or equal to a reference voltage. The device may further include a comparator circuit unit configured to compare the target voltage and a ground voltage when the mirroring current is input.

12 Claims, 9 Drawing Sheets

1000

1000

ZERO CURRENT DETECTION DEVICE

STATEMENT REGARDING GOVERNMENT SPONSORED RESEARCH OR DEVELOPMENT

This work was supported by National Research Foundation of Korea (NRF) grant funded by the Korea government (MSIT; Ministry of Science and ICT) (No. 2020R1C1C1009878, Healthcare Wireless Earphones: Non-invasive Invisible Wireless Biosensors for External Ear EEG Available for Everyday Use, and No. 2022M3E5E9018349, Ultra-Compact Integrated Circuit System for Implantable Personalized Electronic Medication).

CROSS-REFERENCE TO RELATED APPLICATION

This application claims priority to Korean Patent Application No. 10-2023-0100053 filed on Jul. 31, 2023, the entirety of which is incorporated herein by reference for all purposes.

TECHNICAL FIELD

The present disclosure relates to a zero current detection device.

BACKGROUND

A wireless power technology is a technology that has recently been rapidly developed and utilized in various fields.

SUMMARY

One aspect is a wireless power technology for supplying constant power to a load despite a change in distance and a change in load over a wide area.

Another aspect is a zero current detection technology.

Another aspect is a zero current detection technology that consumes little power.

Another aspect is a zero current detection technology capable of generating its own clock signal.

The aspects of the present disclosure are not limited to the foregoing, and other aspects not mentioned herein will be clearly understood by those skilled in the art from the following description.

Another aspect is a zero current detection device, the device comprising: a scaling circuit unit configured to generate a first voltage which is scaled from a target voltage; a mirroring circuit unit configured to generate a mirroring current when the first voltage is higher than or equal to a reference voltage; and a comparator circuit unit configured to compare the target voltage and a ground voltage when the mirroring current is input.

The device may further comprise a clock signal generation circuit unit configured to delay a result of comparing the target voltage and the ground voltage to generate a clock signal for an operation of the comparator circuit unit.

The first voltage may have a phase identical to that of the target voltage, and a maximum magnitude greater than the reference voltage by a preset offset value.

The offset value may cause a magnitude of the first voltage to be greater than or equal to a threshold gate voltage for operating the mirroring circuit unit when a magnitude of the target voltage is greater than or equal to a preset magnitude.

The scaling circuit unit may be configured to receive a second voltage with a phase that is 90° ahead of the phase of the target voltage and a maximum magnitude that is smaller than the maximum magnitude of the target voltage, and output the first voltage by adjusting the phase and magnitude of the second voltage.

The target voltage may be a voltage of a load terminal of the wireless power receiving circuit.

The second voltage may be a voltage of a capacitor of the wireless power receiving circuit.

Another aspect is a zero current detection device, the device comprising: a comparison signal generation circuit unit including a first capacitor having a first terminal connected to a reference voltage, a first switch connected in parallel with the first capacitor, a second switch having one terminal connected to a second terminal of the first capacitor, a D flip-flop configured to delay a clock signal to output a control signal controlling operations of the first switch and the second switch, and an inverter configured to invert a voltage applied to the second terminal of the first capacitor and output the voltage; and a comparator circuit unit configured to compare a target voltage and a ground voltage based on an output of the comparison signal generation circuit unit.

The device may further comprise a counter circuit unit configured to count a number of times the target voltage is greater than the ground voltage or a number of times the target voltage is smaller than the ground voltage based on the output of the comparator circuit unit; and a current output digital-to-analog converter connected to the second terminal of the first capacitor, wherein the current output digital-to-analog converter may be configured to operate based on the counting result.

The first switch and the second switch may be turned on when the delayed clock signal is input, the comparison signal generation circuit unit may be configured to set the voltage at the second terminal of the first capacitor to be lowered when the first switch and the second switch are turned on, and wherein the inverter may be configured to output the reference voltage when the voltage at the second terminal of the first capacitor is lower than or equal to a threshold gate voltage.

The comparator circuit unit is configured to compare the target voltage and the ground voltage when the inverter outputs the reference voltage.

The current output digital-to-analog converter is configured to control a rate at which the voltage at the second terminal of the first capacitor is lowered according to the counting result of the counter circuit.

According to an aspect of the present disclosure, it is possible to implement a wireless power technology for supplying constant power to a load despite a change in distance and a change in load over a wide area.

In addition, according to another aspect of the present disclosure, it is possible to detect a zero current.

In addition, according to another aspect of the present disclosure, it becomes possible to detect a zero current using little power.

In addition, according to another aspect of the present disclosure, it is possible to implement a zero current detection technology capable of generating its own clock signal.

DETAILED DESCRIPTION

Most currently commercialized wireless power technologies only allow limited wireless charging when a wireless charging pad and a charging device are in contact with each other, which may cause inconvenience to users in using wireless charging.

In addition, a zero current detector is a technology widely used in analog circuit design, such as a switching operation of a wireless power receiving device. In order to accurately control the operation of the circuit, the zero current needs to be accurately detected by the zero current detector. When the zero current detector does not properly detect an actual zero current time, a reverse current may flow, which may be a major factor that reduces performance of a circuit system, such as affecting an operation of the circuit system.

In addition, the zero current detector consumes a lot of power when detecting the zero current of a high frequency signal. For example, when detecting the zero current of a 10 MHz frequency signal, the zero current should be detected by sampling a signal with a clock of a frequency higher than 10 MHz, which causes the problem of increasing the amount of power consumed for the zero current detection, heat generation, etc.

Various advantages and features of the present disclosure and methods accomplishing them will become apparent from the following description of embodiments with reference to the accompanying drawings. However, the present disclosure is not limited to exemplary embodiments to be described below, but may be implemented in various different forms, these exemplary embodiments will be provided only in order to make the present disclosure complete and allow those skilled in the art to completely recognize the scope of the present disclosure, and the present disclosure will be defined by the scope of the claims.

In describing embodiments of the present disclosure, detailed descriptions of well-known functions or configurations will be omitted unless they are actually necessary in describing embodiments of the present disclosure. Further, the following terminologies are defined in consideration of the functions in the embodiments of the present disclosure and may be construed in different ways by users, an intention of operators, or conventions. Therefore, the definitions thereof should be construed based on the contents throughout the specification.

A term "~unit," "~or/er," or the like, described below means a unit of processing at least one function or operation and may be implemented by hardware or software or a combination of hardware and software.

Figure 1:
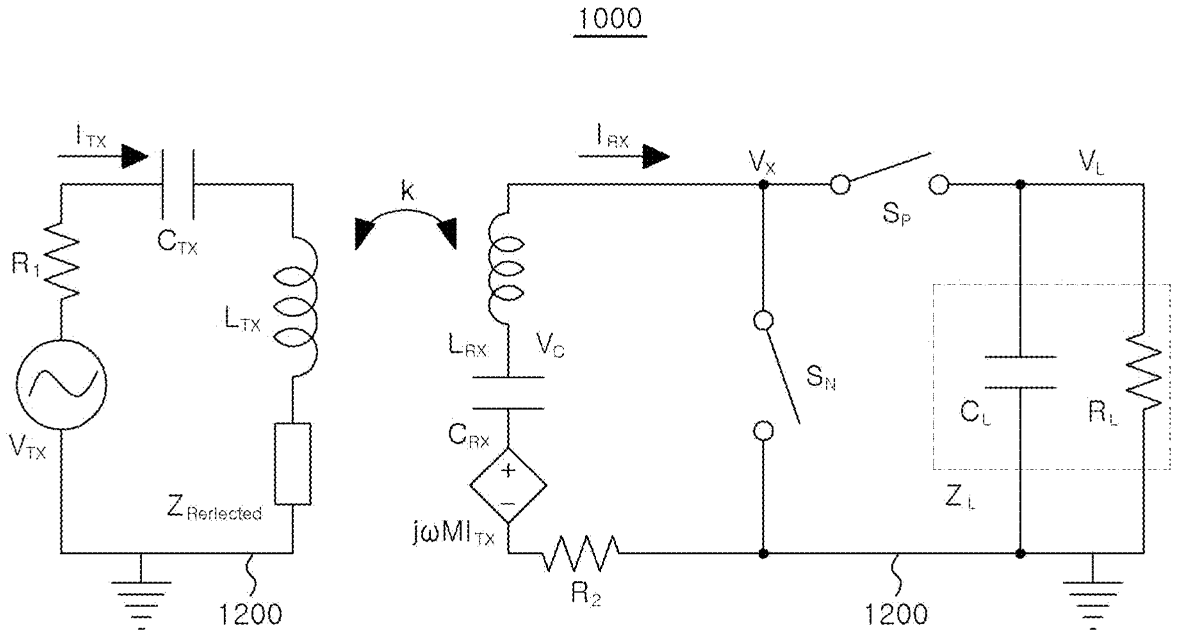
FIG. 1 is a diagram for describing a wireless power system including a wireless power transmitting device and a wireless power receiving device according to an embodiment of the present disclosure.

FIGS. 1 and 2 are diagrams for describing a wireless power system according to an embodiment of the present disclosure.

Figure 2A:
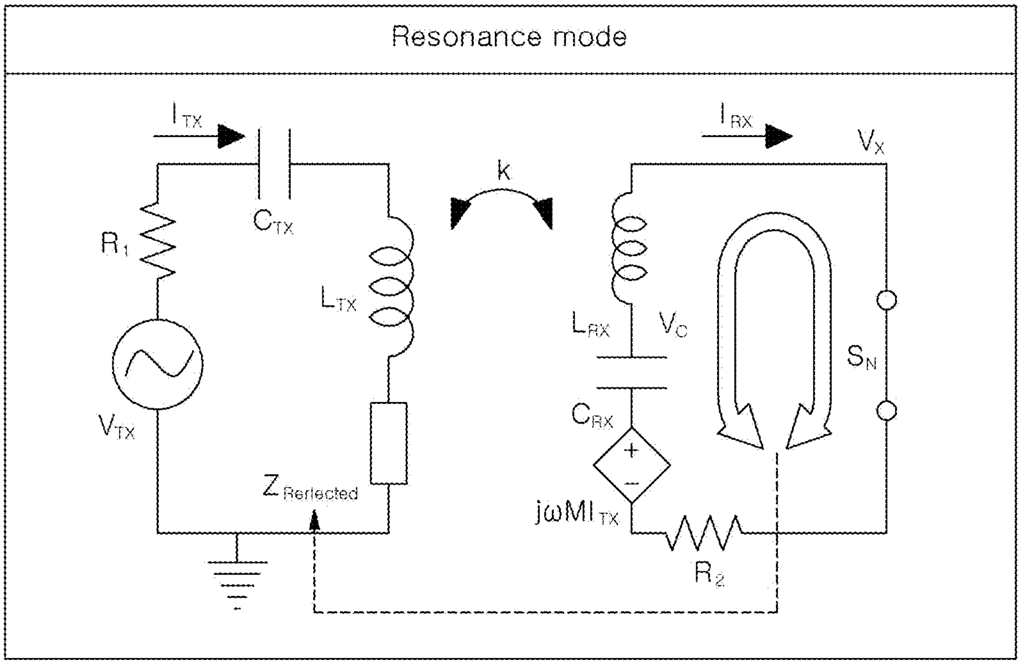
FIG. 2A is a diagram for describing an equivalent circuit of a resonance mode in which a wireless power receiving device according to an embodiment of the present disclosure.
Figure 2B:
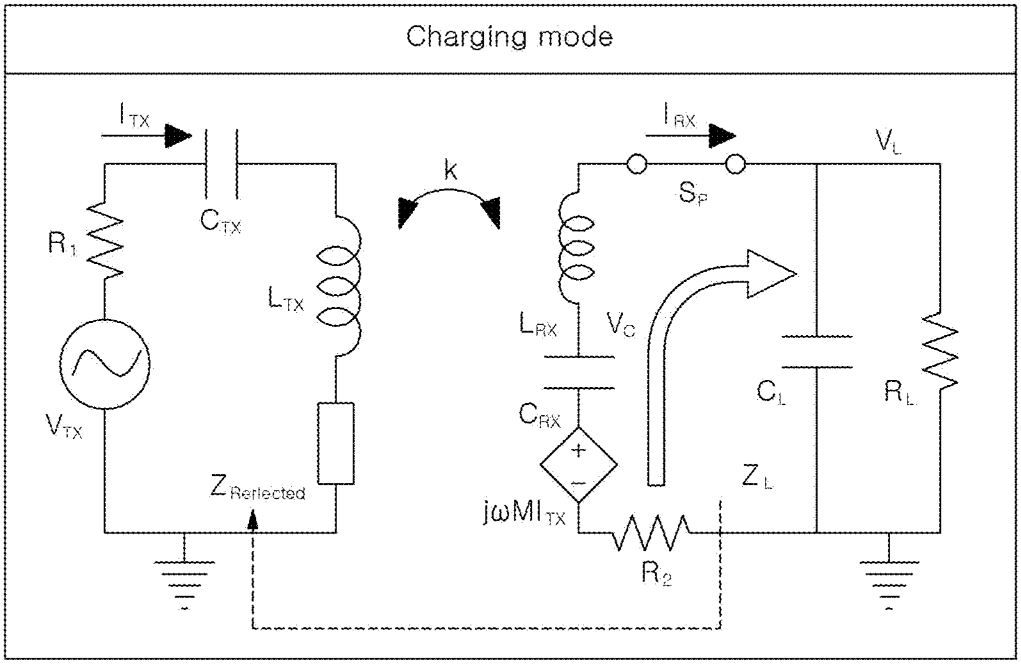
FIG. 2B is a diagram for describing an equivalent circuit of a charging mode in which a wireless power receiving device according to an embodiment of the present disclosure.

FIG. 1 illustrates a circuit diagram of a wireless power system 1000 including a wireless power transmitting device 1100 and a wireless power receiving device 1200, FIG. 2A illustrates an equivalent circuit of a resonance mode in which the wireless power receiving device 1200 receives power, and FIG. 2B illustrates an equivalent circuit of a charging mode in which the wireless power receiving device 1200 supplies power to a load.

In an embodiment, the wireless power system 1000 may operate in a resonance mode at a frequency of 13.56 MHz.

When a switch $S_P$ in FIG. 1 is open and a switch $S_N$ is shorted, as illustrated in FIG. 2A, the wireless power receiving device 1200 allows energy received in a loop formed by an LC tank and a switch $S_N$ designed to have a high Q-factor to resonate and flow in the form of current. In addition, at a load terminal of the wireless power receiving device 1200, power charged in a capacitor $C_L$ of a load terminal is supplied to the load, so the voltage of the capacitor $C_L$ gradually decreases.

In one embodiment, the switch $S_P$ may be configured of a single PMOS switch.

In one embodiment, the switch $S_N$ may be configured of a plurality of NMOS switches.

In addition, when the voltage of the load terminal, that is, the voltage of the capacitor $C_L$, becomes low enough to not supply sufficient power to the load, the wireless power receiving device 1200 short-circuits the switch $S_P$ and opens the switch $S_N$, and thus, operates in the charging mode in which the energy stored in the LC tank supplies power to the load terminal.

In addition, the energy $E_{RX\text{-}RES}$ stored in the LC tank of the wireless power receiving device 1200 may be expressed as Equation 1 below.

$$E_{RX-RES} = \frac{1}{2}C_{RX}\left(\omega M\frac{V_{TX}}{R_1 + \frac{\omega^2 M^2}{R_2 + R_N}}Q_{2-RES}\right)^2 \quad \text{[Equation 1]}$$

In this case, the quality factor (Q factor) $Q_{2\text{-}RES}$ is $\omega L_{RX}/(R_2+R_N)$ and $R_N$ represents the resistance of the switch $S_N$.

In addition, Equation 1 may be approximated as Equation 2 when condition $R_1(R_2+R_N) << \omega^2 M^2$ is satisfied.

$$E_{RX-RES} \simeq \frac{1}{2}C_{RX}\left(\frac{V_{TX}(R_2 + R_N)}{\omega M}Q_{2-RES}\right)^2 \quad \text{[Equation 2]}$$

That is, in the wireless power system 1000, as a distance between the wireless power receiving device 1200 and the wireless power transmitting device 1100 increases, a coupling coefficient M decreases, and the $E_{RX-RES}$ stored in the LC tank of the wireless power receiving device 1200 increases.

Therefore, for the efficiency of the wireless power system 1000 and the user's convenience, even when the distance between the wireless power transmitting device 1100 and the wireless power receiving device 1200 changes, a technology that may supply constant energy is required. The wireless power receiving device 1200 of the present disclosure solves this problem by controlling an operation timing of the switch $S_P$ and switch $S_N$. To this end, the wireless power receiving device 1200 may include a zero current detection device that detects the time when the current becomes zero and a switching control device (hereinafter referred to as ΔΣ-base voltage regulation controller) that generates signals to control the operations of the switch $S_P$ and the switch $S_N$ based on the zero current detection results.

Hereinafter, with reference to FIGS. 3 to 9, the zero current detection device and the ΔΣ-base voltage regulation controller will be described in detail.

Figure 3:
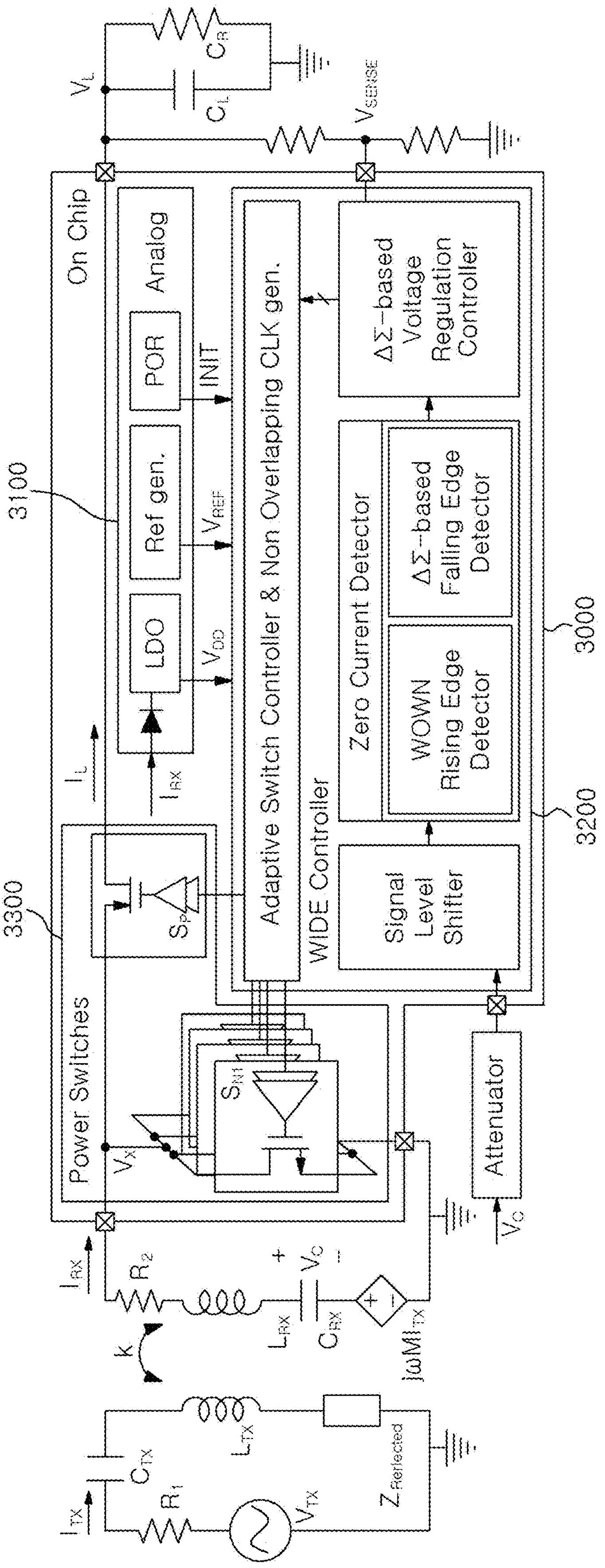
FIG. 3 is a diagram illustrating the configuration of a switching control device that controls the switch of the wireless power receiving device illustrated in FIG. 1.

FIG. 3 is a diagram illustrating the configuration of a switching control device that controls the switch of the wireless power receiving device illustrated in FIG. 1.

Referring to FIG. 3, a switching control device 3000 detects the time when the current of the wireless power receiving device 1200 changes from a negative value to a positive value and the time when the current of the wireless power receiving device 1200 changes from the positive value to the negative value to turn off the switch $S_P$ and the switch $S_N$, and thus, may operate in the resonance mode or the charging mode. To this end, the switching control device 3000 may include an analog block 3100, a switch control signal generation unit 3200, and a switch driving unit (3300).

The analog block 3100 may generate an analog signal for the switching control device to operate.

In one embodiment, the analog block 3100 includes a linear low drop out regulator (LDO) connected to a diode, an internal reference generator, and a power-on-reset (POR), each of which may generate VDD, a reference voltage, and a start signal, respectively. Here, VDD is a voltage of 1.2V, which is a voltage for driving the switching control device.

The switch control signal generation unit 3200 may monitor the voltage of the load terminal to generate a timing signal for the turning on or off operations of the switch $S_P$ and the switch $S_N$ so that the wireless power receiving device 1200 may operate from resonance mode to the charging mode or vice versa.

In one embodiment, the switch control signal generation unit 3200 may include an attenuator that scales the magnitude of the voltage $V_C$ applied to the capacitor $C_{RX}$ of the wireless power receiving device 1200, a signal level shifter that shifts the phase of the scaled voltage $V_C$, the zero current detection device, the ΔΣ-based voltage regulation controller, and the timing signal generator.

Here, the zero current detection device may include a first zero current detection device that detects the time when the current of the wireless power receiving device 1200 changes from a negative value to a positive value and a second zero current detection device that detects the time when the current of the wireless power receiving device 1200 changes from the positive value to the negative value, and a detailed description of this will be described below with reference to FIGS. 4 to 7.

In addition, the ΔΣ-based voltage regulation controller determines whether the wireless power receiving device 1200 operates from the resonance mode to the charging mode or vice versa, based on the detection result of the zero current detection device, and a detailed description thereof will be described below with reference to FIGS. 8 and 9.

The switch driving unit 3300 may turn on or off the switch $S_P$ and the switch $S_N$ according to the timing signal.

Figure 4:
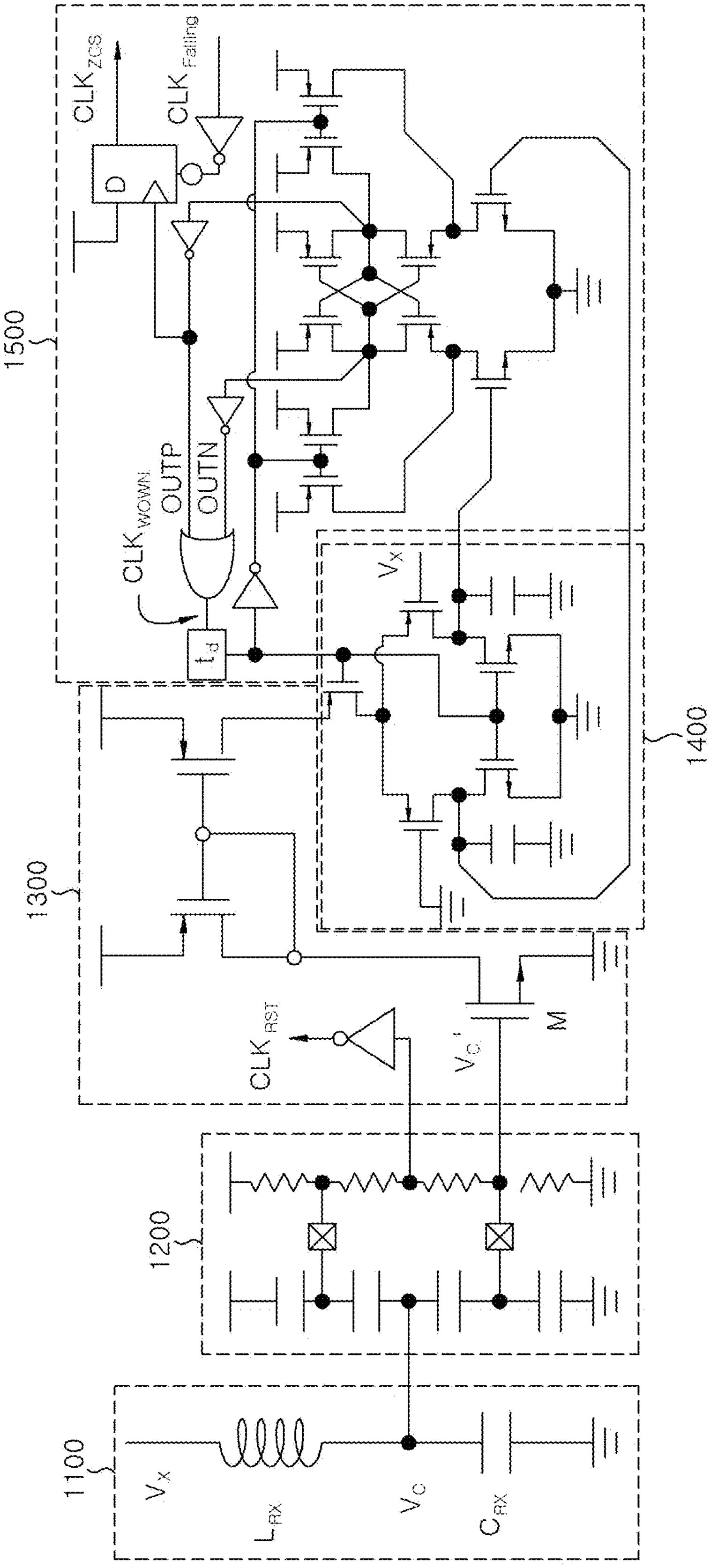
FIG. 4 is a circuit diagram of the zero current detection device according to an embodiment of the present disclosure.

FIG. 4 is a circuit diagram of the zero current detection device according to an embodiment of the present disclosure.

Referring to FIG. 4, the zero current detection device according to the embodiment of the present disclosure is for detecting the time when the current changes from the negative value to the positive value, and may include a wireless power receiving circuit unit 4100, a scaling circuit unit 4200, a mirroring circuit unit 4300, a comparator circuit unit 4400, and a clock signal generation circuit unit 4500.

In one embodiment, the wireless power receiving circuit unit 4100 may include an inductor $L_{RX}$ and a capacitor $C_{RX}$ connected in series to each other of a general wireless power receiving circuit. One terminal of the inductor $L_{RX}$ is connected to the load, and one terminal of the capacitor $C_{RX}$ is connected to a ground. Therefore, one terminal of the inductor $L_{RX}$ becomes a load voltage $V_X$ applied to the load, and when the wireless power receiving circuit operates in a resonance state, the voltage $V_C$ applied to the capacitor $C_{RX}$ may have a phase that is 90° ahead of the phase of the load voltage $V_X$ and a maximum magnitude that is smaller than the maximum magnitude of the load voltage $V_X$.

In other words, when the voltage of the load voltage $V_X$ becomes zero, the current flowing in the wireless power receiving circuit becomes zero, so detecting the time when the load voltage $V_X$ (hereinafter referred to as the target voltage) becomes zero, that is, the time when the current flowing in the wireless power receiving circuit becomes zero, is described as an example.

The scaling circuit unit 4200 may generate a first voltage $V_C$ which is scaled from a target voltage. Specifically, the scale circuit unit may generate the first voltage $V_C$ by shifting the phase of the voltage $V_C$ (hereinafter, the second voltage) applied to the capacitor $C_{RX}$ to have the phase identical to that of the target voltage and by scaling the magnitude to be greater than the reference voltage.

In one embodiment, the scaling circuit unit 4200 may include a plurality of capacitors connected in series to shift the phase of the second voltage.

In one embodiment, the scaling circuit unit 4200 may include a plurality of resistors connected in series to scale the magnitude of the second voltage.

In one embodiment, the first voltage $V_C$ may have the phase identical to that of the target voltage and have a maximum magnitude greater than the reference voltage by a preset offset value. Here, the offset value may be a value that causes the magnitude of the first voltage $V_C$ to be greater than or equal to the threshold gate voltage for operating the mirroring circuit unit 4300 when the magnitude of the target voltage is greater than or equal to a preset magnitude (e.g., 80% of the maximum magnitude of the target voltage). Accordingly, the mirroring circuit unit 4300 operates when the target voltage approaches the peak.

The mirroring circuit unit 4300 may generate a mirroring current I for the comparator circuit unit 4400 to operate based on the first voltage $V_C$.

In one embodiment, the mirroring circuit unit 4300 may generate the mirroring current I when the first voltage $V_C$ is greater than or equal to the threshold gate voltage for driving a MOSFET M of the mirroring circuit unit 4300.

In one embodiment, the MOSFET M may be an N-MOS transistor.

The comparator circuit unit 4400 may compare the magnitude of the ground voltage and the target voltage according to the mirroring current I.

In one embodiment, the comparator circuit unit 4400 may further include a switch in a path through which the mirroring current I of the mirroring circuit unit 4300 is input. Here, the output of the clock signal generation circuit unit 4500 may be input to the switch. Accordingly, the comparator circuit unit 4400 receives the mirroring current I according to the output of the clock signal generation circuit unit 4500, thereby changing the timing when the magnitudes of the ground voltage and the target voltage are compared.

In one embodiment, the comparator circuit unit 4400 may be a dynamic latch comparator.

The clock signal generation circuit unit 4500 may generate a clock signal for operating the comparator circuit unit 4400 based on the result of comparing the magnitudes of the ground voltage and the target voltage.

In one embodiment, the clock signal may be delayed by a delay circuit $t_d$ and input to the switch of the comparator circuit unit 4400. That is, in the present disclosure, the clock signal for operating the comparator circuit unit 4400 is delayed and fed back by the clock signal generation circuit unit 4500.

In one embodiment, the zero current detector of FIG. 1 may extract the time when the current of the circuit subject to the zero current detection changes from a negative number to a positive number.

Figure 5:
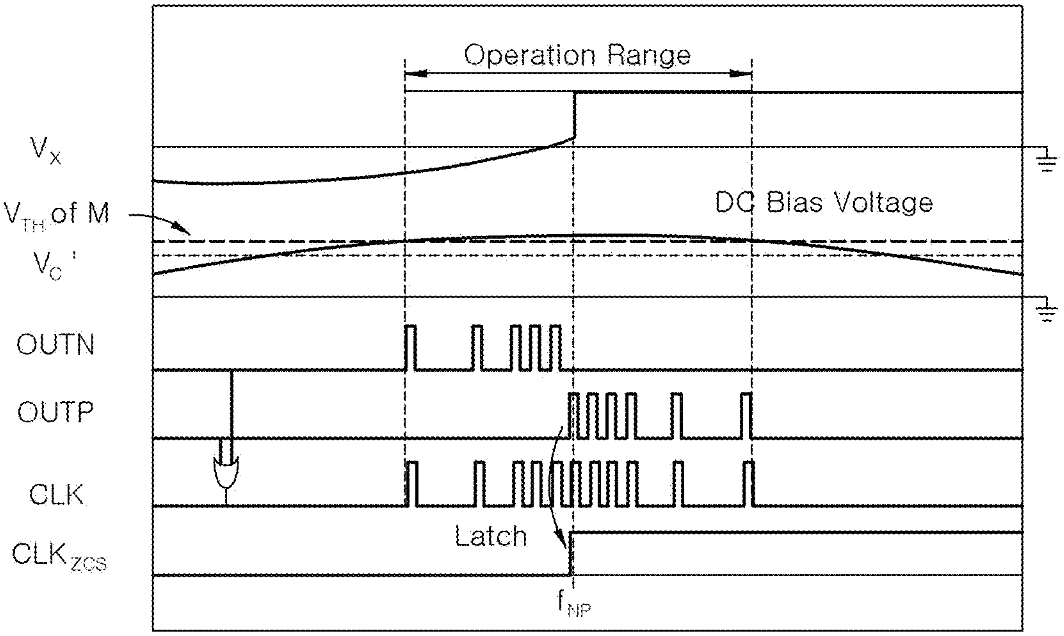
FIG. 5 is a diagram for describing the operation of the zero current detection device illustrated in FIG. 4.

FIG. 5 is a diagram for describing the operation of the zero current detection device illustrated in FIG. 4.

FIG. 5 illustrates signals output from each component of the zero current detection device illustrated in FIG. 4.

The following description will be made on the assumption that the wireless power receiving circuit, which is the target of the zero current detection, is operating in the resonance state.

Since a phase of the second voltage $V_C$ is 90° ahead of the phase of the target voltage $V_X$, and a maximum magnitude of the second voltage $V_C$ is smaller than that of the target voltage $V_X$, the phase of the second voltage $V_C$ is adjusted to be 90° slower and the magnitude thereof is adjusted to be greater than the reference voltage, so the second voltage becomes the first voltage $V_C$, which has the phase identical to that of the load voltage $V_X$ and the maximum magnitude thereof is greater than the reference voltage. The first voltage $V_C$ is applied to a gate terminal of the MOSFET M of the mirroring circuit unit 4300. The mirroring current I is generated in the mirroring circuit unit 4300 when the first voltage $V_C$ becomes greater than or equal to a threshold gate voltage $V_{TH}$ of the MOSFET M. The comparator circuit may compare the magnitudes of the ground voltage and the target voltage $V_X$ when the mirroring current I is input. The clock signal generator circuit unit may delay the result of comparing the ground voltage of the comparator circuit and the target voltage $V_X$ to generate an operation signal for the switch of the comparator circuit.

That is, when the first voltage $V_C$ becomes greater than or equal to the threshold gate voltage $V_{TH}$ (operation range), the comparison is performed between the ground voltage of the comparator circuit and the target voltage $V_X$. In this case, the result of comparing the ground voltage and the target voltage $V_X$ is output as OUTN and OUTP signals. Here, OUTN indicates a case where the target voltage $V_X$ is lower than the ground voltage, and OUTP indicates a case where the target voltage $V_X$ is greater than the ground voltage. FIG. 2 illustrates the process in which the target voltage $V_X$ changes from a negative voltage to a positive voltage, so a time of a first peak with a non-zero value at OUTP means the time when the target voltage $V_X$ changes from a negative number to a positive number. $CLK_{ZCS}$ has a peak from the time when the target voltage $V_X$ changes from a negative number to a positive number.

In addition, when the first voltage $V_C$ is greater than or equal to the threshold gate voltage $V_{TH}$ (operation range), the result of comparing the target voltage $V_X$ and the ground voltage is delayed, so a time interval input to the comparator circuit unit 4400 becomes shorter as the first voltage $V_C$ approaches the maximum value and becomes longer as it decreases after the maximum value. That is, since the comparison operation interval of the comparator circuit unit 4400 becomes very fast at the point where the target voltage $V_X$, which is the time when the first voltage $V_C$ reaches its maximum value, becomes 0, it becomes possible to accurately detect the zero current point. When the zero current detection target circuit of the present disclosure operates at a frequency of 13.56 MHz, the frequency of the clock signal generated in the comparator circuit unit 4400 may be up to 1.25 GHz at the point when the target voltage $V_X$ of the comparator is 0.

Figure 6:
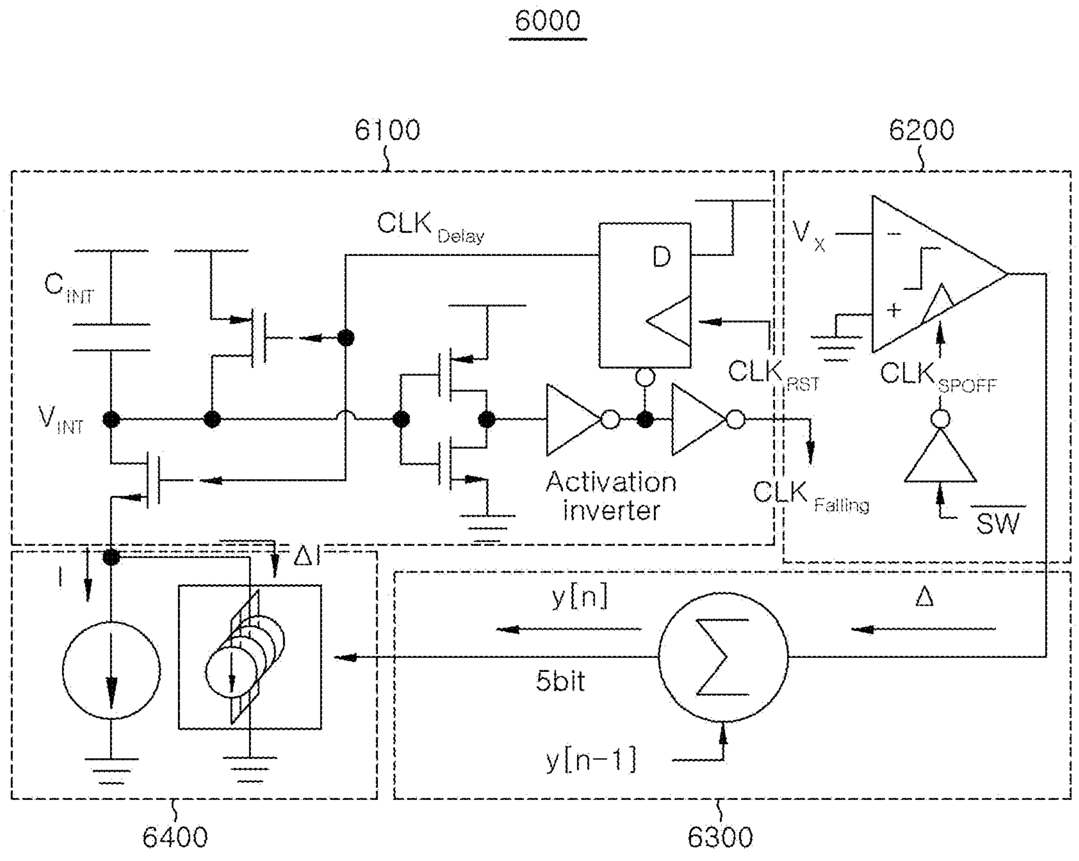
FIG. 6 is a circuit diagram of a zero current detection device according to another embodiment of the present disclosure.

FIG. 6 is a circuit diagram of a zero current detection device according to another embodiment of the present disclosure.

Referring to FIG. 6, the zero current detection device according to another embodiment of the present disclosure is for detecting the time when the current changes from a positive value to a negative value, and may include a comparison signal generation circuit unit 6100, a comparator circuit unit 6200, a counter circuit unit 6300, and a current output digital-to-analog converter 6400 (IDAC).

The comparison signal generation circuit unit 6100 may include a first capacitor $C_{INT}$ that is connected to the reference voltage VDD, a first switch that is connected in parallel with the first capacitor $C_{INT}$, a second switch that is connected in series with the first capacitor $C_{INT}$ and the first switch connected in parallel, a D flip-flop that outputs a signal controlling the operations of the first switch and the second switch, and an inverter that inverts a voltage between the first capacitor and the first switch and outputs the inverted voltage.

In one embodiment, when the first switch is turned off, that is, in an open state, the same voltage as the reference voltage is applied to the first capacitor $C_{INT}$.

In one embodiment, the first switch may be an N-MOS transistor and the second switch may be a P-MOS transistor. Accordingly, when the first switch is turned on (or off), the second switch may be turned off (or on).

In one embodiment, the inverter may output a ground voltage when the voltage between the first capacitor and the first switch exceeds the threshold gate voltage, and output a reference voltage when the voltage between the first capacitor and the first switch is less than or equal to the threshold gate voltage.

In one embodiment, the D flip-flop may delay and output the reference voltage VDD according to the clock signal. In this case, the delayed output signal may be applied to the gate terminals of the first switch and the second switch to control the switching operation.

In one embodiment, the D flip-flop may be reset by inputting the reference voltage to a reset terminal when the reference voltage is output from the inverter.

In one embodiment, the reference voltage output from the inverter may be a clock signal (comparison signal) for the operation of the comparator circuit unit 6200.

The comparator circuit unit 6200 may compare the magnitudes of the target voltage and the ground voltage according to the output of the comparison signal generation circuit unit.

In one embodiment, the comparator circuit unit 6200 may be an inverting comparator.

The counter circuit unit 6300 may collect the result of comparing the target voltage and the ground voltage in the comparator circuit unit 6200.

In one embodiment, the counter circuit unit 6300 may count the number of times the target voltage is greater than the ground voltage and the number of times the target voltage is smaller than the ground voltage.

In one embodiment, the counter circuit unit 6300 may be the digital DE-based voltage regulation controller.

The current output digital-to-analog converter 6400 may control the amount of current flowing in the first switch based on the counting result of the counter circuit unit 6300.

In one embodiment, the power output digital-to-analog converter may control the amount of current flowing through the first switch to control a rate at which the voltage between the first capacitor and the first switch decreases.

In one embodiment, the zero current detector of FIG. 2 may extract the time when the current of the circuit subject to the zero current detection changes from a negative number to a positive number.

Figure 7:
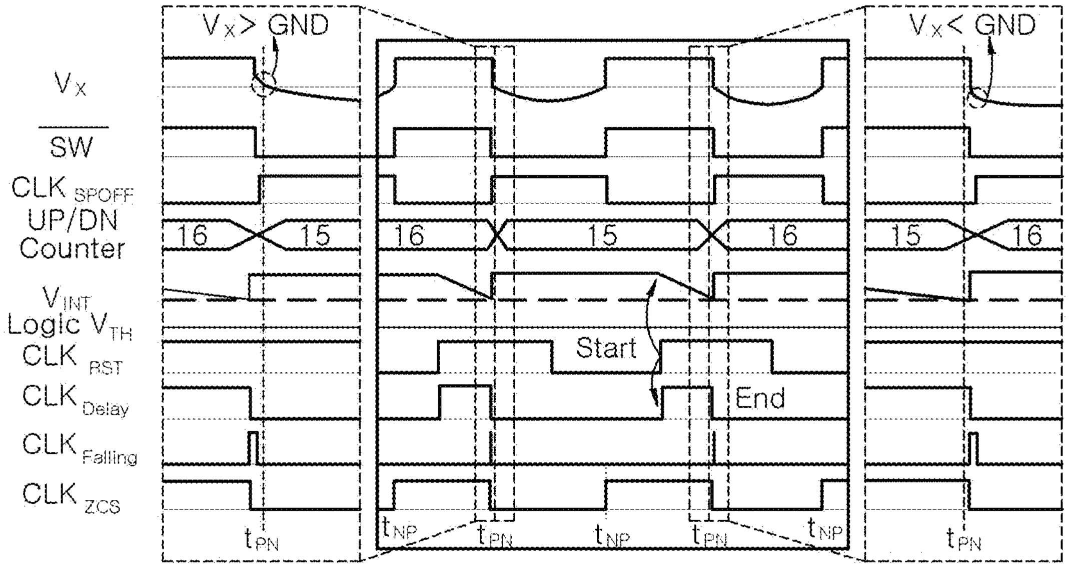
FIG. 7 is a diagram for describing the operation of the zero current detection circuit illustrated in FIG. 6.

FIG. 7 is a diagram for describing the operation of the zero current detection circuit illustrated in FIG. 6.

Referring to FIG. 7, the reference voltage is applied to a node $V_{INT}$, and a clock signal $CLK_{RST}$ applied to the D flip-flop is a 13.56 MHz signal, but may be input as a distorted signal due to a small jitter. When the signal $CLK_{Delay}$ delayed by the D flip-flop becomes logic high, the voltage of node $V_{INT}$ gradually decreases from the reference voltage toward the threshold gate voltage due to the current flow of the current output digital-to-analog converter 6400. Since the voltage of the node $V_{INT}$ is a signal applied to the inverter, when the voltage of the node $V_{INT}$ of the inverter is lower than or equal to the threshold gate voltage, the output of the inverter changes from the ground voltage to the reference voltage. In this case, the output of the inverter is again applied to the reset terminal of the D flip-flop, and the D flip-flop is reset, thereby setting $CLK_{Delay}$ to 0 and outputting the $CLK_{Falling}$ signal. When the $CLK_{Falling}$ signal is output, the comparator circuit unit 6200 compares the target voltage and the ground voltage to determine whether the $CLK_{Falling}$ signal is faster or slower than the point at which it passes the zero current, so the rate at which the voltage of the node $V_{INT}$ is lowered may be adjusted using the counter circuit unit 6300 and the current output digital-to-analog converter 6400. Therefore, by adjusting the rate at which the voltage of the node $V_{INT}$ is lowered and matching the time when the $CLK_{Falling}$ signal passes the zero current, it is possible to detect the time when the zero current is detected.

Figure 8:
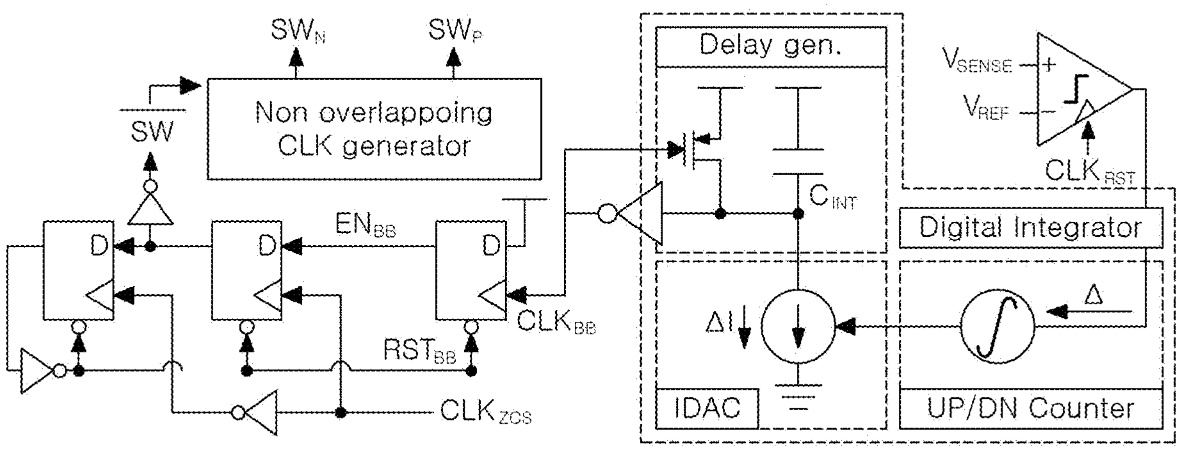
FIG. 8 is a circuit diagram of the ΔΣ-base voltage regulation controller according to the embodiment of the present disclosure.

FIG. 8 is a circuit diagram of the ΔΣ-base voltage regulation controller according to the embodiment of the present disclosure.

Referring to FIG. 8, the ΔΣ-base voltage regulation controller monitors the voltage at the load terminal of the wireless power receiving device 1200 operating at 13.56 MHz, and when the voltage at the load terminal becomes greater (or lower) than the reference load voltage, by controlling the operation of the switch $S_P$ and the switch $S_N$, the time of operating in charging mode until the voltage at the load terminal reaches the reference load voltage may decrease (or increase).

The ΔΣ-base voltage regulation controller according to the embodiment of the present disclosure may include a comparator circuit unit that compares the measurement voltage $V_{SENSE}$ with the reference voltage $V_{REF}$ according to the clock signal $CLK_{RST}$, an up/down counter (UP/DN counter) that counts the comparison result between the measurement voltage $V_{SENSE}$ and the reference voltage $V_{REF}$, a delay signal generator (Delay gen) that generates the delay signal $CLK_{BB}$ based on the counting result, a timing signal generation unit that generates a timing signal SW to control the switch by delaying the zero current detection signal $CLK_{ZCS}$ according to the delay signal $CLK_{BB}$, and a non-overlapping clock signal generator that generates a non-overlapping clock signal to operate the switch $S_P$ and the switch $S_N$ in different states (e.g., when one side is turned on and the other side is turned off).

In one embodiment, the comparator circuit unit may be a dynamic comparator that operates according to the clock signal $CLK_{RST}$.

In one embodiment, the measured voltage $V_{SENSE}$ may be the voltage acquired by scaling the voltage of the load terminal of the wireless power receiving device 1200 using the voltage divider.

In one embodiment, the up/down counter (UP/DN Counter) may count and store the number of times the measurement voltage $V_{SENSE}$ is greater or less than the reference voltage $V_{REF}$.

In one embodiment, the delayed signal generator may include a capacitor $C_{INT}$ having one terminal connected to VDD, a transistor connected in parallel with the capacitor $C_{INT}$, and the current output digital-to-analog converter (IDAC) having a transistor connected in parallel with the capacitor $C_{INT}$, and a current output digital-to-analog converter (IDAC) connected between the other terminal of the capacitor $C_{INT}$ and a battery. The current output digital-to-analog converter (IDAC) may control the rate at which the capacitor $C_{INT}$ is discharged by adjusting the amount of current flowing in ground based on the number stored in the up-down counter. In this case, the voltage at the other terminal of the capacitor $C_{INT}$ is inverted and becomes the delay signal $CLK_{BB}$ input to the timing signal generation unit. In this case, the delay signal $CLK_{BB}$ is inverted by the inverter and input to the gate terminal of the transistor connected in parallel with the capacitor $C_{INT}$.

In one embodiment, the timing signal generation unit may include a first D flip-flop, a second D flip-flop, and a third D flip-flop. The first D flip-flop receives the VDD as input to the data terminal, and outputs a signal $EN_{BB}$ that delays VDD using the delay signal $CLK_{BB}$ as a clock signal. The second D flip-flop receives the signal $EN_{BB}$ as input to the data terminal, delays the signal $EN_{BB}$ using the signal inverted by the zero current detection signal $CLK_{ZCS}$ by the inverter as the clock signal, and outputs the first signal. In this case, the first signal, which is the output of the second D flip-flop, is inverted by the inverter to become a timing signal for controlling the switch, and is transmitted to the non-overlapping clock signal generator. The third D flip-flop receives the first signal as input to the data terminal and outputs a second signal in which the first signal is delayed using the zero current detection signal CLKZCS as the clock signal. In this case, the second signal may be inverted by the inverter and input to the reset terminals of the first D flip-flop, the second D flip-flop, and the third D flip-flop, and the output of the first D flip-flop, the second D flip-flop, and the third D flip-flop may be reset.

Figure 9:
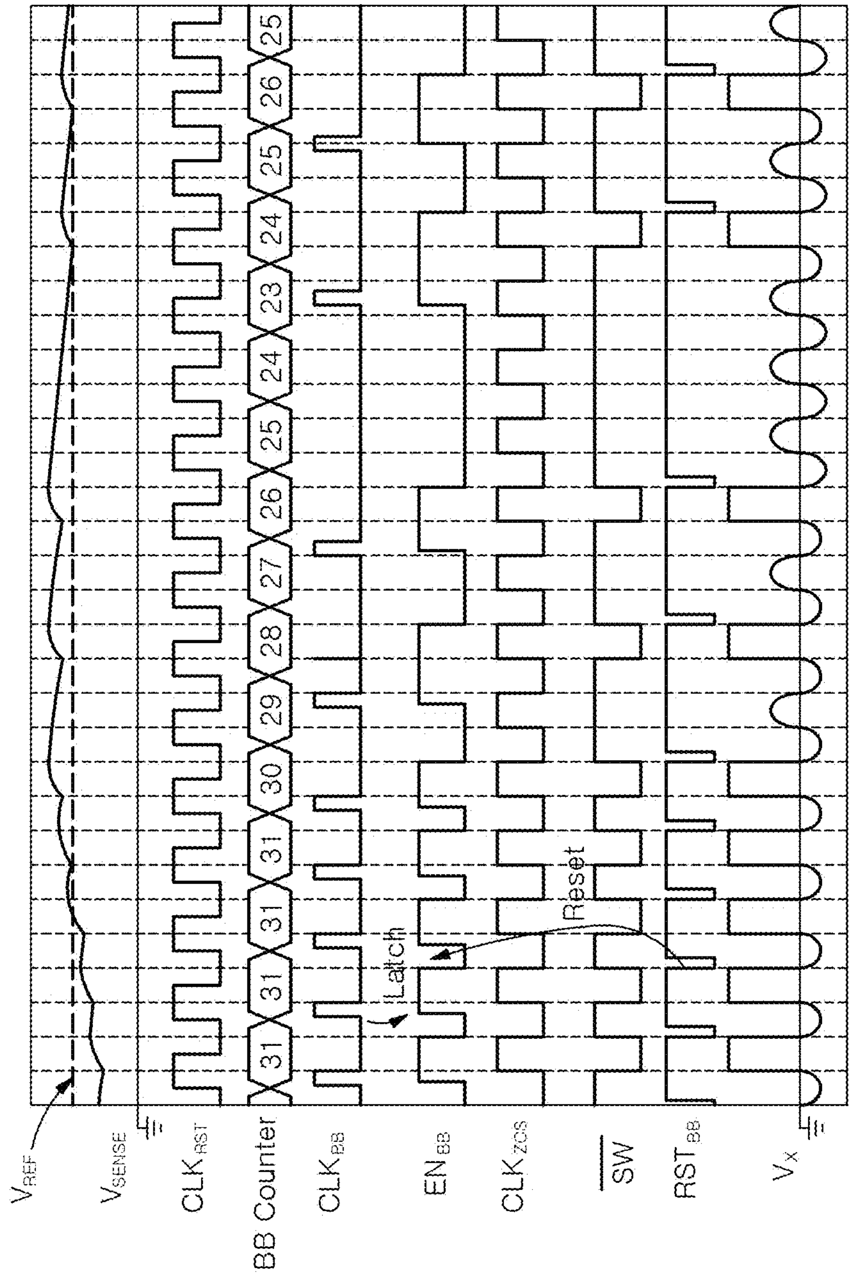
FIG. 9 is a diagram for explaining the operation of the ΔΣ-base voltage regulation controller illustrated in FIG. 8.

FIG. 9 is a diagram for explaining the operation of the ΔΣ-base voltage regulation controller illustrated in FIG. 8.

As illustrated in FIG. 8, the ΔΣ-base voltage regulation controller may measure the voltage $V_{SENSE}$ to which the load voltage $V_L$ is scaled using a voltage divider. The ΔΣ-based voltage regulation controller may compare the voltage $V_{SENSE}$ and the reference voltage $V_{REF}$ using the dynamic comparator that operates according to the clock signal $CLK_{RST}$. The ΔΣ-based voltage regulation controller may store the results of comparing the voltage $V_{SENSE}$ and the reference voltage $V_{REF}$ as the digital information using the up/down counter (UP/DN counter). The ΔΣ-based voltage regulation controller may control the current of the current output digital-to-analog converter (IDAC) based on the information stored in the up-down counter, thereby controlling the rate at which the capacitor $C_{INT}$ of the delay signal generator (Delay gen) is discharged. The ΔΣ-based voltage regulation controller may generate a delay signal $CLK_{BB}$ by controlling the rate at which the capacitor $C_{INT}$ is discharged. When the delay signal $CLK_{BB}$ is generated, the ΔΣ-based voltage regulation controller transmits the zero current detection signal $CLK_{ZCS}$ generated by the zero current detection device to the non-overlapping clock signal generator, thereby generating a switching signal $SW_P$ to control the operation of the switch $S_P$ and a switching signal $SW_N$ to control the operation of switch $S_N$.

Combinations of steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each step of the flowchart. The computer program instructions can also be stored on a computer-usable or computer-readable storage medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each step of the flowchart.

In addition, each step may represent a module, a segment, or a portion of codes which contains one or more executable instructions for executing the specified logical function(s). It should also be noted that in some alternative embodiments, the functions mentioned in the steps may occur out of order. For example, two steps illustrated in succession may in fact be performed substantially simultaneously, or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A zero current detection device comprising:
- a scaling circuit configured to receive a target voltage and generate a first voltage scaled from the target voltage and having a magnitude proportional to the target voltage;
- a mirroring circuit configured to generate a mirroring current when the first voltage is higher than or equal to a reference voltage; and
- a comparator circuit configured to operate in response to the mirroring current generated by the mirroring circuit so that the comparator circuit compares the target voltage and a ground voltage.

2. The zero current detection device of claim 1, further comprising a clock signal generation circuit configured to delay a result of comparing the target voltage and the ground voltage to generate a clock signal for an operation of the comparator circuit.

3. The zero current detection device of claim 1, wherein the first voltage has a phase identical to that of the target voltage, and has a maximum magnitude greater than the reference voltage by a preset offset value.

4. The zero current detection device of claim 3, wherein the offset value is configured to cause a magnitude of the first voltage to be greater than or equal to a threshold gate voltage for operating the mirroring circuit when a magnitude of the target voltage is greater than or equal to a preset magnitude.

5. The zero current detection device of claim 3, wherein the scaling circuit is configured to receive a second voltage with a phase that is 90° ahead of the phase of the target voltage and a maximum magnitude that is smaller than the maximum magnitude of the target voltage, and output the first voltage by adjusting the phase and magnitude of the second voltage.

6. The zero current detection device of claim 5, wherein the target voltage is a voltage of a load terminal of a wireless power receiving circuit.

7. The zero current detection device of claim 6, wherein the second voltage is a voltage of a capacitor of the wireless power receiving circuit.

8. A zero current detection device comprising:
- a comparison signal generation circuit including:
- a first capacitor having a first terminal connected to a reference voltage,
- a first switch connected in parallel with the first capacitor,
- a second switch having one terminal connected to a second terminal of the first capacitor,
- a D flip-flop configured to delay a clock signal to output a control signal controlling operations of the first switch and the second switch, and
- an inverter configured to invert a voltage applied to the second terminal of the first capacitor and output the voltage; and
- a comparator circuit configured to operate in response to an output of the comparison signal generation circuit so that the comparator circuit compares a target voltage and a ground voltage.

9. The zero current detection device of claim 8, further comprising:

a counter circuit configured to count a number of times the target voltage is greater than the ground voltage or a number of times the target voltage is smaller than the ground voltage based on the output of the comparator circuit; and a current output digital-to-analog converter connected to the second terminal of the first capacitor, wherein the current output digital-to-analog converter is configured to operate based on a counting result.

10. The zero current detection device of claim 9, wherein the first switch and the second switch are turned on in response to the delayed clock signal being input, wherein the comparison signal generation circuit is configured to set the voltage at the second terminal of the first capacitor to be lowered in response to the first switch and the second switch being turned on, and wherein the inverter is configured to output the reference voltage in response to the voltage at the second terminal of the first capacitor being lower than or equal to a threshold gate voltage.

11. The zero current detection device of claim 10, wherein in response to the inverter outputting the reference voltage, the comparator circuit is configured to compare the target voltage and the ground voltage.

12. The zero current detection device of claim 10, wherein the current output digital-to-analog converter is configured to control a rate at which the voltage at the second terminal of the first capacitor is lowered according to the counting result of the counter circuit.

* * * * *